US012813217B2

(12) United States Patent
Wu et al.

(10) Patent No.: US 12,813,217 B2
(45) Date of Patent: Nov. 24, 2026

(54) SURFACE STRUCTURE OF AN ELECTROSTATIC CHUCK AND METHOD FOR FORMING THE SAME

(71) Applicant: Feedback Technology Corp., Hsinchu City (TW)

(72) Inventors: Tsung-Feng Wu, Hsinchu City (CN); Guo-Yang Ciou, Hsinchu City (TW); Chia-Te Lin, Hsinchu City (TW); Po-Han Chen, Hsinchu City (TW); Po-Chia Huang, Hsinchu City (TW)

(73) Assignee: FEEDBACK TECHNOLOGY CORP., Hsinchu City (TW)

( * ) Notice: Subject to any disclaimer, the term of this patent is extended or adjusted under 35 U.S.C. 154(b) by 0 days.

(21) Appl. No.: 18/945,027

(22) Filed: Nov. 12, 2024

(65) Prior Publication Data

US 2025/0191955 A1 Jun. 12, 2025

(30) Foreign Application Priority Data

Dec. 8, 2023 (TW) ................................ 112147939

(51) Int. Cl.
*H10P 72/72* (2026.01)
*C23C 28/04* (2006.01)

(52) U.S. Cl.
CPC .......... *H10P 72/722* (2026.01); *C23C 28/042* (2013.01)

(58) Field of Classification Search
None
See application file for complete search history.

(56) References Cited

U.S. PATENT DOCUMENTS 5,910,338 A 6/1999 Donde
8,619,406 B2 12/2013 Cho et al.
(Continued)

FOREIGN PATENT DOCUMENTS

JP H0661335 A 3/1994
JP H08264550 A 10/1996
(Continued)

OTHER PUBLICATIONS

De Naoum et al., "Everything You Need to Know About Hard Coat Anodizing," https://www.xometry.com/resources/machining/hard-coat-anodizing/ (2023). (Year: 2023).*

*Primary Examiner* — David Sample
(74) *Attorney, Agent, or Firm* — LANWAY IPR SERVICES; Chun-Ming Shih

(57) ABSTRACT

The present invention relates to the surface structure of an electrostatic chuck used in semiconductor manufacturing processes. The surface structure comprises a substrate, a first protective coating disposed on the substrate, and a second protective coating disposed on the first protective coating. The first protective coating is deposited on the substrate and is made from materials selected from groups comprising metal oxides, fluorides, and nitrides. It serves as a universal protective barrier against wear, corrosion, and thermal effects. The second protective coating, which is deposited on the first protective coating, possesses a higher hardness than the first protective coating, thereby providing enhanced wear resistance. Additionally, the present invention offers a versatile and effective solution for improving the performance and lifespan of electrostatic chucks in semiconductor manufacturing.

7 Claims, 2 Drawing Sheets

(56) References Cited

U.S. PATENT DOCUMENTS

| | | | |
|---|---|---|---|
| 10,968,507 | B2 | 4/2021 | Iwasaki et al. |
| 2004/0229078 | A1 | 11/2004 | Maeda |
| 2012/0196137 | A1 * | 8/2012 | Vetter ................. C23C 14/0605 106/286.6 |
| 2023/0021394 | A1 * | 1/2023 | Wang .................... C23C 14/221 |
| 2023/0025296 | A1 * | 1/2023 | Chen .................. G05B 19/4183 |
| 2023/0128726 | A1 | 4/2023 | Jeong et al. |
| 2024/0153745 | A1 * | 5/2024 | Woo ........................ C25D 11/18 |
| 2025/0171886 | A1 * | 5/2025 | Ogawa .................... C23C 14/08 |

FOREIGN PATENT DOCUMENTS

| | | | |
|---|---|---|---|
| JP | 2010228965 | A | 10/2010 |
| JP | 2021165435 | A | 10/2021 |
| WO | WO2015093199 | A1 | 6/2015 |

* cited by examiner

SURFACE STRUCTURE OF AN ELECTROSTATIC CHUCK AND METHOD FOR FORMING THE SAME

FIELD OF THE DISCLOSURE

The present invention generally relates to the field of semiconductor manufacturing equipment. More specifically, it pertains to an improved surface structure for electrostatic chucks (E-Chuck) used within semiconductor process chambers.

BACKGROUND OF THE INVENTION

During the manufacturing process of semiconductor wafers, electrostatic chucks are widely employed in various process chambers to secure wafers in place during operations such as heating, adsorption, and rotation. These E-Chucks typically undergo surface treatments to enhance their performance and durability.

A common surface treatment method is thermal spraying. However, as semiconductor manufacturing technologies advance, the surface treatment requirements for electrostatic chucks have become increasingly stringent. Traditional thermal spraying techniques often result in coatings with insufficient density and hardness, which is a significant drawback. Furthermore, the frequent loading and unloading of wafers can lead to the wear of the E-Chuck's protrusions. This wear, in turn, may cause particulate matter to adhere to the backside of the wafers, adversely affecting the yield of subsequent manufacturing processes.

Another prevalent surface treatment method involves the use of sintering techniques. Although sintered electrostatic chucks offer higher hardness, the overall manufacturing costs of such E-chucks are significantly increased.

Therefore, designing an electrostatic chuck with a surface structure that exhibits high hardness, high density, and excellent wear resistance while maintaining cost-effectiveness remains a challenge for those skilled in the art.

SUMMARY OF THE INVENTION

The primary objective of the present invention is to provide a surface structure for an electrostatic chuck that exhibits high hardness, high density, and excellent wear resistance while also offering reduced manufacturing costs.

The present invention addresses the limitations and challenges associated with traditional electrostatic chucks used in semiconductor manufacturing by introducing an innovative surface structure. This surface structure comprises a substrate, a first protective coating disposed on the substrate, and a second protective coating disposed on the first protective coating. The second protective coating possesses a higher hardness than the first protective coating, thereby providing enhanced wear resistance.

Further distinguishing the present invention, the second protective coating has a lower porosity than the first protective coating. This characteristic ensures higher density, contributing to the overall durability and performance of the electrostatic chuck. The first protective coating is selected from groups comprising metal oxides, fluorides, and nitrides and has a thickness ranging from 100 μm to 250 μm. This layer serves as a robust foundation, protecting the underlying substrate and enhancing the overall wear and corrosion resistance of the ESC.

The second protective coating is also selected from groups comprising metal oxides, fluorides, and nitrides but is thinner, with a thickness ranging from 0.5 μm to 20 μm. Despite its reduced thickness, this layer provides exceptional hardness, ranging from 1000 HV to 1500 HV, and has a porosity of less than 1%. These properties make it highly effective in reducing particulate contamination from the E-Chuck to the wafer, thereby improving the yield of subsequent semiconductor manufacturing processes.

In addition to structural features, the present invention also aims to provide a method for forming the electrostatic chuck surface structure. The method includes forming the first protective coating on the substrate, followed by forming the second protective coating on the first protective coating, with optimized deposition conditions tailored for each layer to achieve the desired properties.

By offering a combination of high hardness, low porosity, and excellent wear resistance in a cost-effective manner, the present invention significantly advances the state of the art in electrostatic chuck technology for semiconductor manufacturing.

The foregoing, as well as additional objects, features and advantages of the invention will be more readily apparent from the following detailed description, which proceeds with reference to the accompanying drawings.

BRIEF DESCRIPTION OF THE DRAWINGS

The objects, spirits, and advantages of the preferred embodiments of the present disclosure will be readily understood by the accompanying drawings and detailed descriptions, wherein.

DESCRIPTION OF THE PREFERRED EMBODIMENTS

Figure 1:
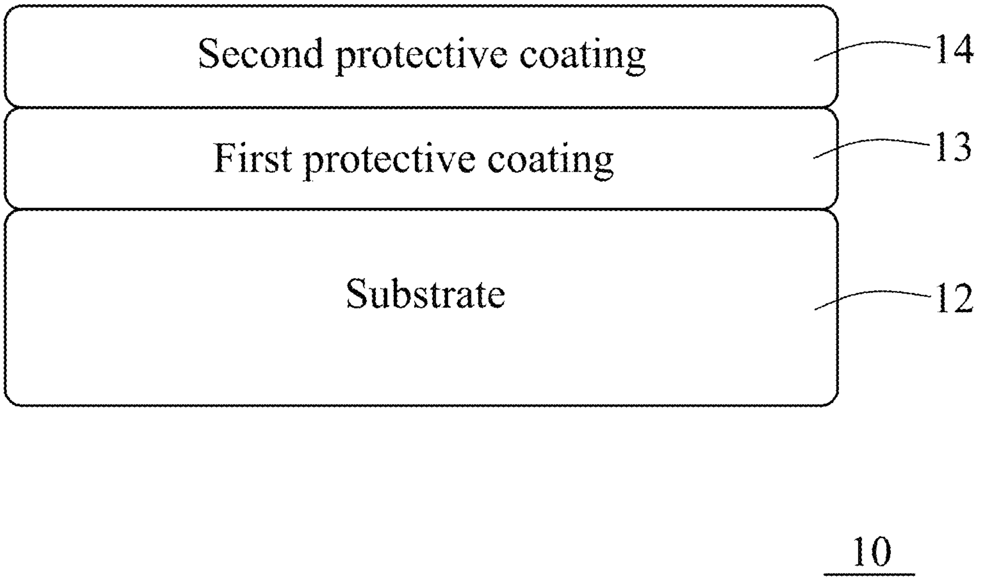
FIG. 1 illustrates a schematic diagram of the surface structure 10 of an electrostatic chuck embodiment according to the present invention.

Referring to FIG. 1, FIG. 1 illustrates a schematic diagram of the surface structure 10 of an electrostatic chuck embodiment according to the present invention. The present invention provides an advanced surface structure for an electrostatic chuck, wherein the unique surface structure design is tailored to meet the stringent requirements of modern semiconductor manufacturing processes. The surface structure 10 of the electrostatic chuck in this embodiment comprises three main components: a substrate 12, a first protective coating 13, and a second protective coating 14.

The substrate 12 is typically made from conductive or semiconductor materials capable of generating an electrostatic field, which secures semiconductor wafers in place during various manufacturing processes. In this embodiment, the substrate 12 may be fabricated from aluminum, silicon, or other commonly used metals and ceramic materials in the industry.

The substrate 12 serves as the foundational element of the electrostatic chuck, playing a critical role in the overall performance and functionality of the ESC. Generally, the protective layers are deposited on the substrate 12, which is responsible for generating the electrostatic field that holds the semiconductor wafer in position during the manufacturing process.

In this embodiment, the selection of the substrate 12 material must consider several factors. First, the material must be conductive or semiconductor to generate a sufficient electrostatic field. Common materials include aluminum, silicon, and other metals or ceramics compatible with semiconductor manufacturing environments. Additionally, the material should possess high thermal conductivity to ensure uniform heating of the wafer, thereby maintaining process consistency.

Furthermore, the structural integrity of the substrate 12 is another important consideration. It must be sufficiently robust to withstand mechanical stresses generated during wafer loading and unloading processes, as well as thermal stresses during wafer heating. Moreover, the substrate 12 is typically designed with specific geometries to optimize its mechanical properties, such as tensile strength and fracture toughness.

Additionally, prior to the deposition of protective coatings, the substrate 12 undergoes a series of surface preparation steps. These may include cleaning, etching, and priming to ensure the surface is free from contaminants and conducive to the adhesion of subsequent layers. The surface roughness of the substrate 12 may also be controlled within a specific range to optimize the bond strength between the substrate 12 and the first protective coating 13.

The electrical properties of the substrate 12, such as resistivity and dielectric constant, are also adjusted to optimize the electrostatic holding force. These properties are particularly important when handling ultra-thin or irregularly shaped wafers, as they ensure the wafer remains securely fixed throughout the manufacturing process.

Referring again to FIG. 1, the first protective coating 13 is directly applied to the surface of the substrate 12. The first protective coating 13 serves to protect the substrate 12 from wear and corrosion, thereby extending the lifespan of the electrostatic chuck (ESC). In this embodiment, the first protective coating 13 is formed using thermal spraying techniques, such as atmospheric plasma spraying (APS), suspension plasma spraying (SPS), or vacuum plasma spraying (VPS). Each method has its own advantages and limitations, and the choice of method typically depends on factors such as the desired coating thickness, porosity, and hardness. The thickness of the first protective coating 13 ranges from 100 μm to 250 μm. This range provides sufficient protection for the substrate 12 while allowing effective heat conduction.

The materials for the first protective coating 13 are selected from groups comprising metal oxides, fluorides, and nitrides, such as $TiO_2$, $Al_2O_3$, $YF_3$, $Er_2O_3$, $Gd_2O_3$, $Y_2O_3$, etc. These materials are renowned for their excellent thermal stability, corrosion resistance, and mechanical properties, making them ideal choices for this application.

The hardness of the first protective coating 13 is designed to be within the range of 400 HV to 700 HV, providing a balance between mechanical strength and flexibility.

Due to the relatively thick nature of the first protective coating 13, thermal spraying techniques are employed to increase the deposition rate. Depending on the process design, the porosity of the first protective coating 13 ranges from 1% to 5%.

The deposition process is meticulously controlled to achieve the desired properties of the first protective coating 13. For example, an arc current ranging from 200 A to 600 A and a rotating disc speed from 5 RPM to 30 RPM may be used. The choice of carrier gas, such as argon, nitrogen, or helium, and its flow rate are also optimized to ensure high-quality deposition.

Through the careful design and implementation of the first protective coating 13, the present invention significantly enhances the performance and lifespan of the electrostatic chuck. The first protective coating 13 possesses sufficient thickness and strength to increase the wear and corrosion resistance of the substrate.

Referring again to FIG. 1, the second protective coating 14 is applied atop the first protective coating 13. The second protective coating 14 is much thinner, with a thickness range from 0.5 μm to 20 μm. Despite its reduced thickness, the second protective coating 14 provides exceptionally high hardness, ranging from 1000 HV to 1500 HV, thereby offering superior wear resistance and reducing the risk of particle contamination.

The second protective coating 14 is formed using Physical Vapor Deposition (PVD) techniques to create a high-density and high-hardness coating. Specifically, the PVD process is highly controlled to achieve the desired properties of the second protective coating 14. Parameters such as chamber temperature, deposition rate, ion source plasma power, and gas flow rate are finely tuned. For example, the chamber temperature may range from 25 °C to 200 °C, the deposition rate from 0.1 nm/s to 1.5 nm/s, and other parameters are adjusted accordingly.

Additionally, PVD methods such as electron beam physical vapor deposition (E-Gun PVD) or ion-assisted electron beam physical vapor deposition provide specific advantages in coating quality and process control.

Although the materials for the second protective coating 14 are also selected from groups comprising metal oxides, fluorides, and nitrides, similar to the first protective coating 13, the use of vacuum PVD techniques allows for the production of coatings with higher hardness and lower porosity. The porosity of the second protective coating 14 is designed to be less than 1%, significantly lower than that of the first protective coating 13. This low porosity enhances the hardness and wear resistance of the second protective coating 14, making it ideal for prolonged contact with semiconductor wafers and effectively reducing particle contamination from the E-Chuck to the wafer.

In summary, the second protective coating 14, as the topmost layer in direct contact with the semiconductor wafer, provides exceptionally high hardness, low porosity, and outstanding wear resistance. This enhances the corrosion and wear resistance of the first protective coating 13. Therefore, the surface structure 10 of the electrostatic chuck in this embodiment addresses the shortcomings of existing electrostatic chucks by not only enhancing wear resistance but also significantly reducing the risk of particle contamination, thereby lowering overall manufacturing costs and improving the yield and reliability of the semiconductor manufacturing process.

Figure 2:
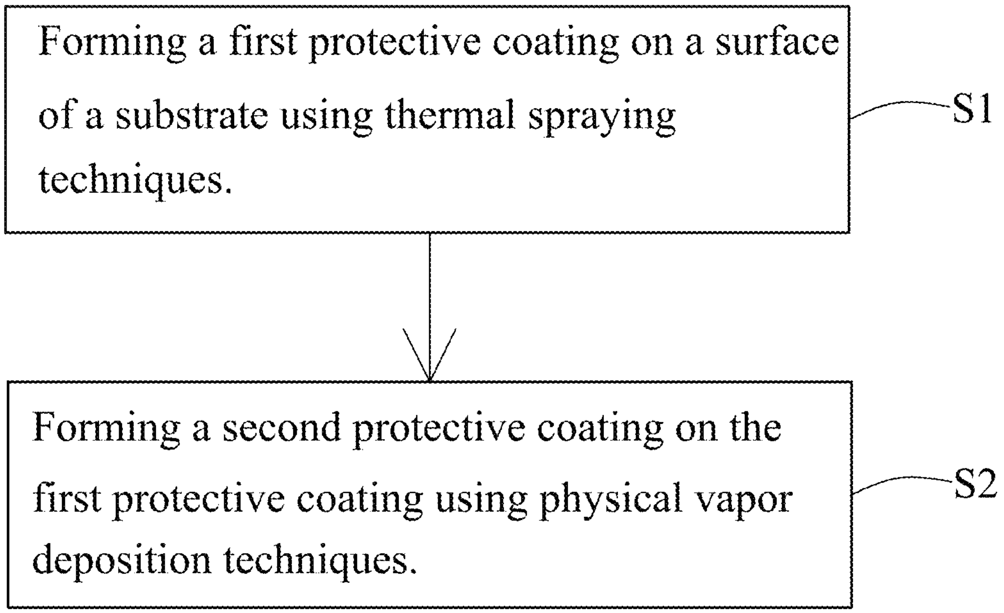
FIG. 2 depicts a flowchart of a method for forming the surface structure 10 of the electrostatic chuck.

Referring to FIG. 2, FIG. 2 illustrates a flowchart of a method for forming the surface structure 10 of the electrostatic chuck. Below, the manufacturing process of the surface structure 10 of the electrostatic chuck in this embodiment is described in detail.

Firstly, referring to step S1, the first protective coating 13 is deposited on the substrate 12 using thermal spraying techniques under specific conditions, such as atmospheric plasma spraying (APS), suspension plasma spraying (SPS), and vacuum plasma spraying (VPS). The three thermal spraying techniques are detailed as follows:

1. Atmospheric Plasma Spraying (APS): APS is one of the most commonly used techniques for depositing the first protective coating 13. In this method, the coating material is introduced into a high-temperature plasma jet, which melts the particles and propels them toward the substrate 12. APS is typically conducted at atmospheric pressure and is suitable for a wide range of materials, including metal oxides, fluorides, and nitrides. Process parameters such as arc current (200 A-600 A), carrier gas flow rate (30 L/min-200 L/min), and rotating disc speed (5 RPM-30 RPM) can be adjusted to achieve the desired coating properties.

2. Suspension Plasma Spraying (SPS): SPS is a variant of conventional plasma spraying that utilizes a suspension of fine powder particles in a liquid medium. This method allows for the deposition of layers with unique microstructures and enhanced properties. SPS is particularly suitable for depositing coatings with complex compositions, such as mixed oxides. The process conditions are similar to APS but may require additional control to manage the supply rate of the suspension and plasma parameters.

3. Vacuum Plasma Spraying (VPS): VPS is performed in a controlled vacuum environment, minimizing oxidation and contamination during the spraying process. This method is highly suitable for materials sensitive to atmospheric conditions. VPS allows for stricter control over the microstructure and properties of the coating. The vacuum pressure during the process ranges from $5.0\times10^{1}$ to $1.0\times10^{-2}$ Torr, and the preheating temperature can be set between 100 °C and 300 °C to enhance coating adhesion.

Furthermore, the plasma spraying deposition process is controlled by several parameters to achieve the desired properties of the first protective coating 13. These include an arc current ranging from 200 A to 600 A, a substrate rotation speed from 5 RPM to 30 RPM, and the type of carrier gas, such as argon, nitrogen, or helium. The gas flow rate is adjusted between 30 L/min and 200 L/min, and the process pressure may vary from 1 atmosphere to $1.0\times10^{-2}$ Torr. The plasma spraying technique is particularly suitable for depositing thick coatings ranging from 100 μm to 250 μm, thereby providing robust protection for the metal components of the electrostatic chuck.

Additionally, an optional but typically beneficial step in the process is the preheating of the substrate 12. The preheating temperature of the substrate 12 can range from 100° C. to 300° C., which aids in improving the adhesion and density of the deposited layer. Moreover, when the thermal properties of the substrate 12 material differ from those of the coating material, preheating the substrate 12 significantly enhances the adhesion between the substrate 12 and the first protective coating 13.

Subsequently, referring to step S2, the second protective coating 14 is deposited on the first protective coating 13 using Physical Vapor Deposition (PVD) techniques under optimized conditions. The PVD techniques include electron beam physical vapor deposition (E-Gun PVD) and ion-assisted electron beam physical vapor deposition. These PVD methods are detailed as follows:

1. Electron Beam Physical Vapor Deposition (E-Gun PVD): E-Gun PVD is a highly specialized thin-film deposition method. In this technique, an electron beam is used to evaporate the source material, which then condenses on the substrate 12 to form the coating. The process is conducted in a high-vacuum chamber, allowing precise control over the film's microstructure and properties. Deposition conditions can be finely tuned, including chamber temperature (25 °C to 200 °C), deposition rate (0.1 nm/s to 1.5 nm/s), and process pressure ($1.0\times10^{-2}$ to $1.0\times10^{-6}$ Torr). This method is particularly suitable for depositing coatings with high hardness (1000-1500 HV) and low porosity (<1%).

2. Ion-Assisted Electron Beam Physical Vapor Deposition: This is an advanced variant of E-Gun PVD, wherein an ion source assists the deposition process. Ion assistance helps enhance the density, adhesion, and other mechanical properties of the film. Ion source parameters, such as plasma power, electron beam current (0-1500 mA), and voltage (100 V-1500 V), can be adjusted to achieve the desired coating characteristics. The gas flow rates for argon and oxygen can be adjusted between 5 sccm to 50 sccm and 10 sccm to 200 sccm, respectively.

Regardless of whether electron beam physical vapor deposition (E-Gun PVD) or ion-assisted electron beam physical vapor deposition is used, both methods are highly suitable for depositing the second protective coating 14 composed of metal oxides, fluorides, or nitrides, with thicknesses ranging from 0.5 μm to 20 μm.

Furthermore, the optimized conditions mentioned above include chamber temperature, deposition rate, and process pressure. For instance, the chamber temperature ranges from 25 °C to 200 °C, the deposition rate from 0.1 nm/s to 1.5 nm/s, and the ion source plasma power can be finely adjusted. Additionally, the electron beam current can range from 0 to 1500 mA, and the voltage from 100 V to 1500 V.

Moreover, the carrier gases used in the PVD techniques, such as argon and oxygen, have flow rates ranging from 5 sccm to 50 sccm and 10 sccm to 200 sccm, respectively, while the process pressure is maintained between $1.0\times10^{-2}$ and $1.0\times10^{-6}$ Torr. By optimizing the deposition methods, materials, and process parameters under these conditions, the second protective coating 14 is formed with superior properties that exceed the stringent requirements of semiconductor manufacturing, thereby significantly enhancing performance and extending the lifespan of the electrostatic chuck.

Therefore, compared to traditional methods that utilize sintering to form the surface structure of the electrostatic chuck, the present method employs thermal spraying techniques in conjunction with Physical Vapor Deposition (PVD) methods to generate the first protective coating 13 and the second protective coating 14. This approach effectively reduces the cost of manufacturing the surface structure 10 of the electrostatic chuck.

In summary, the present invention provides a surface structure for an electrostatic chuck and its method of formation, which not only meets the performance and durability requirements of contemporary semiconductor manufacturing processes but also surpasses these requirements. Thus, the present invention represents a significant advancement in the field by cost-effectively delivering a combination of high hardness, low porosity, and excellent wear resistance.

Although the invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A surface structure of an electrostatic chuck, comprising:

a substrate;

a first protective coating disposed on a surface of the substrate, wherein the first protective coating comprises YF3, wherein the first protective coating is formed by a thermal spraying technique, wherein the first protective coating has a thickness between 100 μm and 250 μm, wherein the first protective coating has a hardness between 400 HV and 700 HV, and wherein the first protective coating has a porosity between 1% and 5%; and a second protective coating disposed on the first protective coating, wherein the second protective coating is formed by a physical vapor deposition technique, wherein the second protective coating has a thickness between 0.5 μm and 20 μm, wherein the second protective coating has a hardness between 1000 HV and 1500 HV, and wherein the second protective coating has a porosity of less than 1%;

wherein the second protective coating has a hardness greater than the first protective coating; and wherein the porosity of the second protective coating is less than the porosity of the first protective coating.

2. The surface structure of claim 1, wherein the first protective coating is formed by a thermal spraying technique selected from the group consisting of atmospheric plasma spraying (APS), suspension plasma spraying (SPS), and vacuum plasma spraying (VPS).

3. The surface structure of claim 1, wherein the second protective coating is formed by a physical vapor deposition technique selected from the group consisting of electron-beam physical vapor deposition (E-Gun PVD) and ion-assisted electron-beam physical vapor deposition.

4. The surface structure of claim 1, wherein the substrate comprises aluminum or silicon.

5. The surface structure of claim 1, wherein the second protective coating is a topmost layer configured to directly contact a semiconductor wafer during use.

6. The surface structure of claim 1, wherein the second protective coating is formed by ion-assisted electron-beam physical vapor deposition.

7. The surface structure of claim 1, wherein the second protective coating comprises at least one material selected from the group consisting of metal oxides, fluorides, and nitrides.

* * * * *